United States Patent [19]

Rosenthal

[11] Patent Number: 4,468,686
[45] Date of Patent: Aug. 28, 1984

[54] FIELD TERMINATING STRUCTURE
[75] Inventor: Bruce Rosenthal, Sunnyvale, Calif.
[73] Assignee: Intersil, Inc., Cupertino, Calif.
[21] Appl. No.: 289,061
[22] Filed: Nov. 13, 1981
[51] Int. Cl.³ .................. H01L 29/40; H01L 29/78; H01L 29/34
[52] U.S. Cl. .................................. 357/53; 357/23; 357/52
[58] Field of Search .............. 357/53, 23 R, 23 TF, 357/52, 13 LM, 13 R, 13 U, 23 HV, 23 VD, 41, 47, 236 P

[56] References Cited

U.S. PATENT DOCUMENTS

| | | | |
|---|---|---|---|
| 3,405,329 | 10/1968 | Loro et al. | 357/53 |
| 3,582,727 | 6/1971 | Granger et al. | 357/53 X |
| 3,753,055 | 8/1973 | Yamashita et al. | 357/23 R |
| 3,764,406 | 10/1974 | Bosselaar | 357/53 |
| 3,845,331 | 10/1974 | Luscher | 357/24 X |

OTHER PUBLICATIONS

Conti et al., "Surface Breakdown in Silicon Planar Diodes Equipped with Field Plate", *Solid State Electronics,* vol. 15, (1972), pp. 93–105.

*Primary Examiner*—Martin H. Edlow
*Assistant Examiner*—J. L. Badgett
*Attorney, Agent, or Firm*—Spensley Horn Jubas & Lubitz

[57] ABSTRACT

An improved field terminating structure for a semiconductor device provides a well defined voltage gradient in the vicinity of a p-n junction to reduce the electric field near the junction and increase the junction breakdown voltage. The structure includes one or more MOS-type field effect transistors operably connected to one of the regions of the junction. A portion of the potential difference applied across the junction corresponding to the threshold voltage of each transistor is distributed across the surface of the device near the junction.

11 Claims, 4 Drawing Figures

FIELD TERMINATING STRUCTURE

BACKGROUND OF THE INVENTION

1. Field of the Invention

The present invention relates to semiconductor devices, and more particularly, to field terminating structures for improving the breakdown voltage of high voltage semiconductor devices.

Semiconductor devices such as diodes, transistors, thyristors, integrated circuits and the like generally have one or more p-n junctions formed in a substrate of semiconductor material. A p-n junction is a boundary between a region of p-type material and a region of n-type material. These regions are typically formed by diffusing impurities into the substrate. The impurities generally diffuse laterally as well as vertically into the substrate. In order to increase the packing density of the various elements on the substrate it is necessary to minimize the amount of lateral diffusion. This accomplished by making the diffusions relatively shallow.

Electric fields are inherently generated at the p-n junction, with the intensity of the field at a particular location being related to the curvature of the diffusion. Shallow diffusions have a relatively small radius of curvature at the edges of the diffusion, which accentuates the electric field. A reverse biasing voltage applied across the p-n junction further increases the electric field. If the intensity of the electric field becomes too great at any particular point, the p-n junction can break down. The voltage at which a particular p-n junction breaks down is typically referred to as the breakdown voltage. Because of the relatively small radius of curvature at the edges of shallow diffusions, shallow diffusions generally have a lower breakdown voltage than deeper diffusions. Thus, while it is desirable to utilize shallow diffusions so as to increase the packing density of elements such as transistors on a chip, the use of such diffusions brings about the undesirable result of reducing breakdown voltage.

2. Description of the Prior Art

Several types of structures have been utilized to improve the breakdown voltage of a p-n junction. One technique is the use of one or more guard rings diffused into the semiconductor material (FIG. 1). The guard rings, also called floating field rings, are intended to drop the applied voltage along the surface of the material to gradually reduce the intensity of the electric field in the area of the junction curvature. One disadvantage of the guard rings is that the actual voltage gradient obtained critically depends upon the spacing of the guard rings. Furthermore, the guard rings do not resolve the problem of mobile charge carriers in the insulating oxide layer and on the surface of the semiconductor material. These carriers can be attracted by the potential applied to one of the electrodes of the junction, which can adversely affect the shape of the depletion region of the junction close to the surface, with a resulting increase in the electric field magnitude. Furthermore, these carriers can cause an inversion layer on one side of the junction such that if the inversion layer reaches the electrode, current may flow directly, bypassing the p-n junction, and enormously increasing leakage current.

Another technique for increasing the breakdown voltage of shallow diffused junctions is the junction field plate (FIG. 2) which generally is a metal plate overlapping the p-n junction on an insulating layer of silicon dioxide. The field plate is added to a device to deplete the surface of the semiconductor material of charge carriers in the vicinity of the junction edge so as to reduce the electric field and thereby increase the breakdown voltage. Also, the field plate is intended to prevent the formation of an inversion layer bypassing the p-n junction by attracting mobile ions toward the field plate and away from the semiconductor material surface. However, the electric field created by the field plate extending over the junction can also inadvertently cause the appearance of an inversion layer in other regions of the p-n junction. In order to avoid this effect, another electrode, typically an annular ring, is deposited on the oxide surface and electrically connected to an additional diffused ring known as a channel stopper. These additional structures further complicate the construction of the device and make more difficult an accurate modeling of the device.

SUMMARY OF THE INVENTION

It is an object of the present invention to provide an improved field terminating structure for increasing the breakdown voltage of a p-n junction while maintaining high reliability.

It is another object of the present invention to provide an improved field terminating structure which is relatively uncomplicated and is predictable in operation.

The present invention provides a field terminating structure which includes a field effect transistor having a gate electrode operably connected to the p-region or the n-region of a p-n junction. The field effect transistor has a predetermined threshold voltage. When a reverse biasing voltage across the p-n junction exceeding the threshold voltage of the transistor is applied, the transistor is turned on. This causes a portion of the applied voltage, corresponding to the threshold voltage, to be distributed across the transistor channel, thereby decreasing the electric field intensity near the junction. Accordingly, the breakdown voltage of the junction is increased. Since the operation of a field effect transistor is relatively well understood, the operation of the present invention is highly predictable and relatively easy to model. Furthermore, as will become more apparent in the following detailed description, the present invention provides inherent protection against the surface accumulation of charge carriers and the related reliability problems. Furthermore, the improved field terminating structure of the present invention can be constructed at higher densities than comparable prior art designs.

DETAILED DESCRIPTION OF THE DRAWINGS

Figure 1:
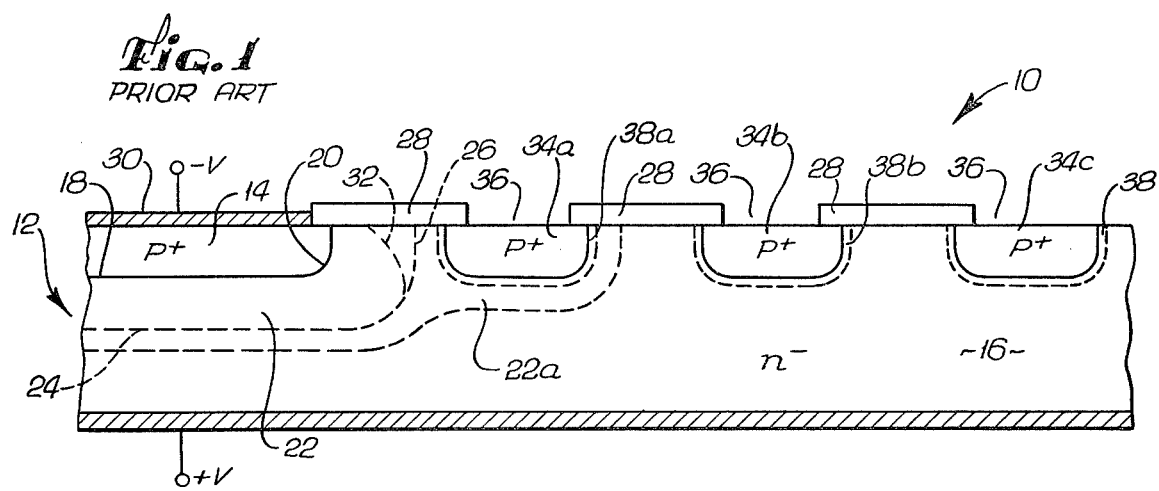
FIG. 1 is a cross-section of an example of a prior art field terminating structure.

FIG. 1 is a cross-sectional view of a semiconductor device 10 which illustrates an example of a prior art field terminating structure known as guard rings. The device 10 has a main p-n junction 12 between a p+ region 14 and an n− substrate region 16. The p+ region 14 is generally formed by a shallow diffusion which results in a generally planar area 18 with a circular-cylindrical portion 20 at the edges. As is well known, a depletion region 22 is formed at the p-n junction 12, with the predominant portion of the depletion region extending into the more lightly doped n− region 16.

With the application of a reverse biasing voltage, the depletion region is enlarged. Following the contour of the junction 12, the depletion region 22 also has a planar area 24 and a curved portion 26 and induces an electric field through the p-n junction 12. If the applied reverse voltage exceeds a certain level, the electric field through the p-n junction 12 will become large enough to cause a breakdown of the p-n junction 12, allowing current to flow from the n− region 16 to the p+ region 14. The value of the breakdown voltage is usually determined by the curved cylindrical portion 26, since the electric field at that point is generally much higher than at the planar area 24. Generally, the smaller the radius of curvature of the diffusion, the more intense the electric field is at that point. Thus, shallow diffusions tend to have a lower breakdown voltage than deeper diffusions.

Another problem arising from the use of shallow diffusions is the presence of extraneous surface charges which affect the shape of the junction depletion region close to the surface of the device. Semiconductor devices usually have a layer of insulating material such as silicon dioxide, indicated at 28, which define windows through which the diffusions of the junctions are made. A negative potential applied to an electrode 30 disposed over the p+ region 14 tends to attract mobile ions (which in this case are positive) toward the electrode 30. Positive surface charges in the oxide layer 28 cause an accumulation of electrons in the comparatively lightly doped n− region 16, which causes a narrowing of the depletion region 22 close to the surface, as indicated at 32. This results in a further increase in the electric field magnitude, which further decreases the breakdown voltage of the device 10. Furthermore, if the positive charge on the oxide layer 28 is large enough, it may also invert a portion of the p+ region 14, forming an n-type channel in the p+ region 14. If an n-type channel from the n− region 16 reaches the electrode 30, the p-n junction 12 will be by-passed, greatly increasing the leakage current.

Despite the problem of reduced breakdown voltage, it is desirable to use shallow planar junctions because of their good stability and ability to achieve higher packing density than deeper diffusions. It is desirable, therefore, to provide shallow planar junctions with high breakdown voltages. FIG. 1 shows a prior art approach to this problem known as guard rings or field limiting rings. The device 10 has a plurality of guard rings 34a, 34b and 34c, each of which is a p+ region diffused through a window 36 in the oxide layer 28. Each guard ring is floating electrically and has a depletion region 38a–38c, respectively. As the reverse voltage applied across the main junction 12 is increased, the depletion region 22 will expand out and will reach the depletion region 38a of the guard ring 34a before the breakdown voltage of the planar area 24 is reached. After the depletion region 22 reaches the first guard ring 34a, any further increase in the applied voltage will cause a further increase in the size of the depletion region 38a around the guard ring 34a, as indicated at 22a. Thus, the guard rings spread out the depletion region of the main junction 12, which increases the effective radius of curvature of the region at that point. This provides a gradual decrease in the surface potential and the electric field.

Although the guard ring method may help reduce the problems caused by curvature of the electric field, it does not alleviate the previously mentioned surface charge accumulation problem. Thus, there remains a reliability problem with this prior art structure. Slightly conducting material such as semi-insulating polysilicon has been substituted for the oxide layer 28 to conduct away the accumulated charge but this significantly increases the leakage current. Furthermore, the distances between guard rings are critical in that slight changes in the actual diffusion distances between rings has a severe effect on the actual voltage distribution across the surface of the device 10. In addition, trapped charges in the oxide layer between adjacent guard rings can cause conduction between the rings further degrading their performance.

Figure 2:
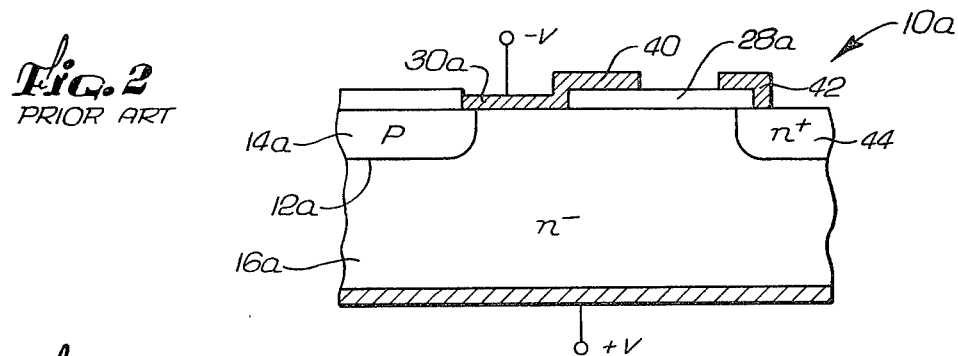
FIG. 2 is a cross-section of another example of a prior art field terminating structure.

Another prior art structure is shown in FIG. 2. The device 10a has a metal field plate 40 which is electrically connected to a p-region electrode 30a over the p-region 14a of a main p-n junction 12a. The field plate 40 is disposed over the surface of the p-n junction 12a, with an insulating layer of silicon dioxide 28a disposed therebetween. A reverse biasing potential applied across the p-n junction 12a places a negative potential on the field plate 40. The negative potential repels electrons which, under optimized conditions, depletes the surface of the n− region 16a thereby spreading the depletion region. If the oxide layer 28a increases in thickness as the distance from the junction 12a increases, the electric field is gradually reduced and the breakdown voltage is increased.

Since the field plate 40 repels electrons, an inversion layer in the p-region 14a beneath the field plate 40 can be prevented from forming. However, the negative charge on the field plate 40 attracts positive ions, so that rather than an n-channel inversion layer forming in the p-region 14a beneath the field plate 40, a p-channel inversion layer can be formed in the n− region 16a beneath the field plate. In order to avoid this, an annular metal electrode ring 42 is often added to attact electrons and counter the tendency of the field plate 40 to invert the n− region 16a. Furthermore, a n+ diffused ring 44 known as a channel stopper is also often added and electrically connected to the annular ring 42. The channel stopper 44 is typically doped to a sufficiently high level to prevent the negatively biased field plate 40 from inverting the n+ region of the channel stopper 44. The resulting structure is rather complicated and difficult to model.

Figure 3:
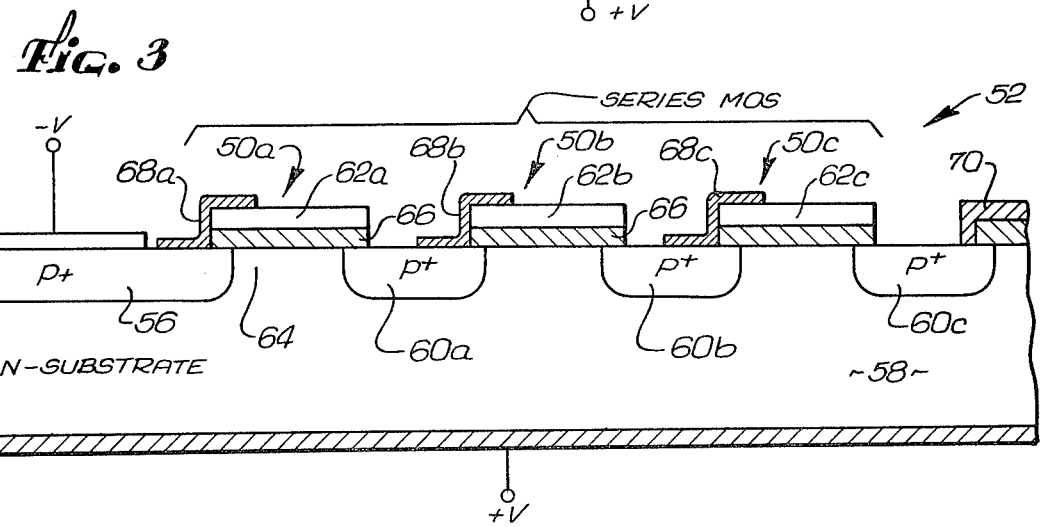
FIG. 3 is a cross-section of a field terminating structure in accordance with a preferred embodiment of the present invention.

Referring now to FIG. 3, a field terminating structure in accordance with a preferred embodiment of the present invention is shown which allows the achievement of a gradual reduction in the field potential across the surface of a p-n junction while reducing the critical tolerances previously required and also providing excellent reliability. The field terminating structure of the illustrated embodiment includes a MOS (metal-oxide-semiconductor) field-effect transistor 50a formed across the surface of a semiconductor device 52. The device 52 has a main p-n junction 54 between a p+ region 56 and an n− substrate 58.

The MOS field-effect transistor 50a includes a p+ diffusion region 60a and a polysilicon gate electrode 62a disposed over the portion of the n⁻ region 58 between the p+ region 56 of the main junction 54 and the p+ region 60a. The gate electrode 62a is separated from the surface of the device 52 by an insulating oxide layer 66, and is electrically connected to the p+ region 56 of the main junction 54 by a metallization contact layer 68a. Thus, the p+ region 60a forms a source region and the p+ region 56 of the main junction 54 forms a drain region, with the portion of the n⁻ region 58 between forming a gate region or channel 64 between the source and drain regions.

The MOS transistor 50a is designed to have a relatively high threshold voltage of approximately −50 volts, at which point the transistor will turn on. Thus, when the voltage applied across the main junction 54 exceeds this threshold voltage, the transistor 50a will turn on in the enhancement mode, applying the threshold voltage of 50 volts across the transistor channel 64. This allows a gradual reduction in the voltage along the surface of the device 52 which also reduces the electric field in the vicinity of the junction 54.

Furthermore, the voltage gradient along the surface is distributed in a well defined manner. For example, if the channel 64 between the source region 60a and the drain region 56 of the MOS transistor 50a is approximately 25 microns, with a threshold voltage of approximately 50 volts the voltage gradient across the surface will be approximately 2 volts per micron. Thus, the ability is provided to accurately define the surface potential near the junction which will allow the minimization of field curvature breakdowns associated with shallow diffusion junctions.

In addition, since the transistor 50a operates in the enhancement mode when turned on, an inversion layer is intentionally formed in the n⁻ substrate 58 between the p+ regions 56 and 60. The negative potential applied to the gate electrode 62a attracts positive ions to the surface of the substrate 58 causing the formation of the inversion layer. This intentional use of the mobile ions by the field terminating structure of the present invention provides excellent reliability since the problem of inadvertent conduction experienced in previous field terminating structures is avoided.

Where larger breakdown voltages are desired, as many MOS transistors as desired can be cascoded in a series, connection as shown in FIG. 3. Thus, a MOS transistor 50b has a source region 60b and a gate electrode 62b which is connected by a metallization contact layer 68b to the source region 60a of the preceeding MOS transistor 50a. The region 60a thus functions both as the source region of the MOS transistor 50a and the drain region of the next MOS transistor 50b. The gate electrode 62c of a third MOS transistor 50c is connected in a similar manner to the source region 60b of the MOS transistor 50b (and drain region 60b of the transistor 50c).

Accordingly, the potential difference applied across the main junction 54 is distributed across the surface of the device 52, with each of the MOS transistors dropping a voltage coresponding to its associated threshold voltage. The threshold voltage of the transistors is a function of the concentration of n-type carriers in the n-region 58 and the thickness of the gate oxide layers 66. These two parameters are easily and accurately controlled by well known manufacturing techniques. Thus, it is relatively easy to control the resultant voltage gradient across the surface of the device 52.

Figure 4:
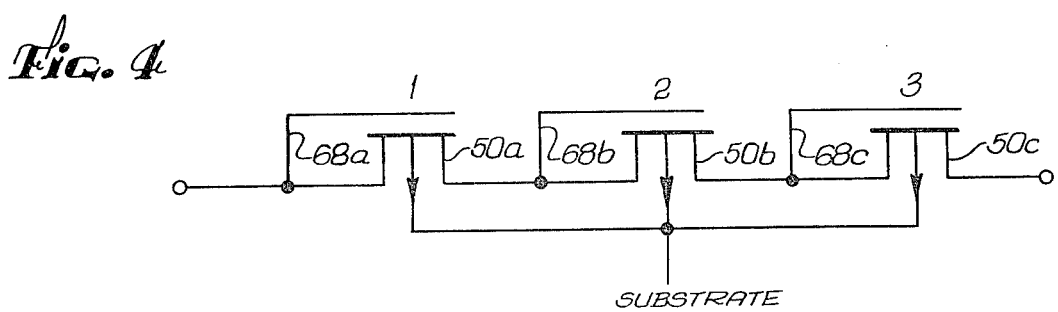
FIG. 4 is a schematic diagram of the field terminating structure of FIG. 3.

Furthermore, the operation of the field terminating structure of the illustrated embodiment is relatively easy to model, as represented by the schematic diagram shown in FIG. 4. There it is seen that the structure functions as a plurality of series connected MOS transistors with the gate and drain of each transistor connected to the source of the preceeding transistor. The number of series-connected transistors fabricated on the device 52 depends upon the magnitude of the breakdown voltage desired. For example, the following table indicates the suggested number of transistors to insure a particular breakdown voltage:

TABLE

| Breakdown Voltage | Number of Transistors |
|---|---|
| 100 | 1 |
| 300 | 3 |
| 500 | 5 |
| 700 | 7 |

An additional advantage of the present invention is the high device density obtainable with the field terminating structure of the illustrated embodiment. It has been found that fewer MOS transistors are required to achieve a particular breakdown voltage than the number of guard rings necessary to achieve a comparable breakdown voltage. Hence, less of the semiconductor active area is required for the field terminating structure of the present invention.

A metal plate 70 may optionally be added to the last p+ diffusion (p+ region 60c in FIG. 3) to further spread the applied voltage. It will, of course, be understood that other modifications of the present invention, in its various aspects, will be apparent to those skilled in the art, some being apparent only after study and others being merely matters of routine electronic design. For example, the field terminating structure can be fabricated over a p type substrate such that the MOS transistors will be n-channel transistors rather than p-channel. Other embodiments are also possible with their specific designs dependent upon the particular application. As such, the scope of the invention should not be limited by the particular embodiment herein described but should be defined only by the appended claims and equivalents thereof.

I claim:

1. In a semiconductor device having a p-n junction between a p-region and an n-region of a semiconductor material, and a contact for applying a reverse bias voltage across the p-n junction, a field terminating structure for reducing the electric field generated at the junction comprising:

a field-effect transistor having a predetermined threshold voltage, said transistor including a source region formed within one of the p or n regions and having the same conductivity type as the other of the p or n regions a drain region defined by said other of the p or n regions, and a gate electrode insulatively disposed over said one of the p or n regions and extending from the source region to said other of the p or n regions and operably connected to the drain region, wherein a reverse biasing voltage applied across the p-n junction, which exceeds the transistor threshold voltage, turns the transistor on, thereby decreasing the intensity of the electric field at the p-n junction and increasing the breakdown voltage of the junction.

2. The structure of claim 1 further comprising at least one additional series-connected field-effect transistors, each of said additional transistors having a predetermined threshold voltage and including a source region, formed within said one of the p or n regions, a drain region defined by the source region of the preceeding transistor and a gate electrode insulatively disposed over said one of the p or n regions between the source and drain regions of the additional transistor and operably connected to the drain region of the additional transistor wherein a reverse biasing voltage applied across the p-n junction turns on succeeding transistors as the biasing voltage exceeds the cumulative threshold voltages of the transistors to thereby distribute the biasing voltage over the transistors.

3. The structure of claim 1 wherein the p-region and n-region form at least a portion of the active circuits of the device, and the source region of the field terminating structure is disposed at the periphery of the active circuits of the device to enclose the active circuits of the device.

4. The structure of claim 1 wherein the threshold voltage of the field effect transistor is approximately 100 volts.

5. The structure of claim 2 further comprising a conductive plate electrically connected to the source of the last series-connected transistor to further distribute the biasing voltage.

6. In a semiconductor device having a substrate of a first conductivity type and a p-n junction between a first region of the first conductivity type, a second region of a second conductivity type formed at the surface of the first region and a contact electrically coupled to the substrate for applying a reverse bias voltage across the p-n junction, a field terminating structure for reducing the intensity of the electric field generated at the p-n junction, comprising:
 a third region of the second conductivity type formed at the surface of the first region and displaced from the second region;
 an electrode layer insulatively disposed over the first region and extending from the second region to the third region; and
 a second contact electrically coupling the electrode layer to the second region of the p-n junction;
 wherein the electrode layer defines a channel within the first region extending from the second region to the third region upon the application of a reverse bias voltage to the p-n junction in excess of a predetermined threshold voltage and the channel distributes a portion of the applied voltage along the channel to reduce the electric field in the vicinity of the junction.

7. The structure of claim 6 further comprising fourth and fifth regions the second conductivity type formed at the surface of the first region and displaced from each other and the third region;
 second and third electrode layers insulatively disposed over the first region between the third and fourth regions, and the fourth and fifth regions, respectively; and
 third and fourth contacts electrically coupling the second and third electrode layers to the third and fourth regions, respectively;
 wherein the regions form three series-connected FET transistors and a reverse biasing voltage across the p-n junction turns on succeeding transistors as the biasing voltage exceeds the cumulative threshold voltages of the transistors to thereby distribute the bias voltage over each turned on transistor.

8. The structure of claim 6 wherein the threshold voltage is approximately 100 volts.

9. The structure of claim 6 wherein the substrate includes the first region.

10. The structure of claim 6 wherein the third region encompasses the periphery of the device to enclose the second region of the device.

11. In a semiconductor device having a substrate of a first conductivity type and a p-n junction between a first region of the first conductivity type and a second region of the second conductivity type formed at the surface of the first region, and a contact electrically coupled to the substrate for applying a reverse bias voltage across the p-n junction, a field terminating structure for reducing the intensity of the electric field generated at the p-n junction comprising:
 a third region of the second conductivity type formed at the surface of the first region, displaced from the second region and encompassing the periphery of the device;
 an electrode layer insulatively disposed over the first region between the second and third regions and extending from the second region to the third region; and
 a contact layer electrically coupling the electrode layer to the second region;
 wherein the electrode layer defines a channel within the first region extending from the second region to the third region and coupling the second region to the third region upon the application of a reverse bias voltage to the p-n junction in excess of a predetermined threshold voltage and the channel distributes a portion of the applied voltage along the channel to reduce electric field in the vicinity of the junction.

* * * * *